United States Patent
Suda et al.

(10) Patent No.: US 11,972,947 B2
(45) Date of Patent: Apr. 30, 2024

(54) MANUFACTURING METHOD FOR SEMICONDUCTOR LAMINATED FILM, AND SEMICONDUCTOR LAMINATED FILM

(71) Applicants: NATIONAL UNIVERSITY CORPORATION TOKYO UNIVERSITY OF AGRICULTURE AND TECHNOLOGY, Fuchu (JP); National Institute of Information and Communications Technology, Tokyo (JP)

(72) Inventors: Yoshiyuki Suda, Fuchu (JP); Takahiro Tsukamoto, Fuchu (JP); Akira Motohashi, Fuchu (JP); Kyohei Degura, Fuchu (JP); Katsumi Okubo, Fuchu (JP); Takuma Yagi, Fuchu (JP); Akifumi Kasamatsu, Koganei (JP); Nobumitsu Hirose, Koganei (JP); Toshiaki Matsui, Koganei (JP)

(73) Assignees: National University Corporation Tokyo University Of Agriculture And Technology (JP); National Institute of Information and Communications Technology (JP)

( * ) Notice: Subject to any disclaimer, the term of this patent is extended or adjusted under 35 U.S.C. 154(b) by 526 days.

(21) Appl. No.: 17/197,137

(22) Filed: Mar. 10, 2021

(65) Prior Publication Data
US 2021/0189549 A1 Jun. 24, 2021

Related U.S. Application Data

(62) Division of application No. 16/317,751, filed as application No. PCT/JP2017/025436 on Jul. 12, 2017, now Pat. No. 11,492,696.

(30) Foreign Application Priority Data

Jul. 15, 2016 (JP) .................. 2016-140117

(51) Int. Cl.
*H01L 21/02* (2006.01)
*C23C 14/06* (2006.01)
(Continued)

(52) U.S. Cl.
CPC ........ *H01L 21/02381* (2013.01); *C23C 14/06* (2013.01); *C23C 14/14* (2013.01);
(Continued)

(58) Field of Classification Search
None
See application file for complete search history.

(56) References Cited

U.S. PATENT DOCUMENTS 3,993,533 A 11/1976 Milnes et al.
6,855,649 B2 2/2005 Christiansen et al.
(Continued)

FOREIGN PATENT DOCUMENTS

JP 2006-100834 A 4/2006
JP 2008-021674 A 1/2008
(Continued)

OTHER PUBLICATIONS

"Epitaxial growth of SiGe thin films by ion-beam sputtering", Applied Surface Science 113/114 (1997) pp. 43-47 (Year: 1997).
(Continued)

*Primary Examiner* — Michelle Mandala
(74) *Attorney, Agent, or Firm* — Harness, Dickey & Pierce, P.L.C.

(57) ABSTRACT

A semiconductor laminate film includes a silicon substrate and a semiconductor layer formed on the silicon substrate and containing silicon and germanium. The semiconductor
(Continued)

layer having a surface roughness Rms of 1 nm or less. Further, the semiconductor layer satisfies the following relationship $t \leq 0.881 \times x^{-4.79}$ where t represents a thickness (nm) of the semiconductor layer, and x represents a ratio of the number of germanium atoms to a sum of the number of silicon atoms and the number of germanium atoms in the semiconductor layer. Also, the semiconductor layer being a mixed crystal semiconductor layer containing silicon and germanium.

5 Claims, 10 Drawing Sheets

(51) Int. Cl.
| | |
|---|---|
| C23C 14/14 | (2006.01) |
| C23C 14/16 | (2006.01) |
| C23C 14/34 | (2006.01) |
| H01L 29/161 | (2006.01) |
| H01L 29/165 | (2006.01) |
| H01L 29/737 | (2006.01) |
| H01L 29/778 | (2006.01) |
| H01L 29/78 | (2006.01) |
| H01L 29/812 | (2006.01) |
| H01L 29/88 | (2006.01) |

(52) U.S. Cl.
CPC ............ *C23C 14/165* (2013.01); *C23C 14/34* (2013.01); *H01L 21/02365* (2013.01); *H01L 21/02532* (2013.01); *H01L 21/02631* (2013.01); *H01L 29/161* (2013.01); *H01L 29/165* (2013.01); *H01L 29/737* (2013.01); *H01L 29/778* (2013.01); *H01L 29/78* (2013.01); *H01L 29/812* (2013.01); *H01L 29/88* (2013.01)

(56) References Cited

U.S. PATENT DOCUMENTS

| | | | |
|---|---|---|---|
| 7,514,726 B2* | 4/2009 | Park | C30B 25/02 257/190 |
| 2003/0107032 A1 | 6/2003 | Yoshida | |
| 2005/0285159 A1* | 12/2005 | Chan | H01L 29/045 257/288 |
| 2008/0194078 A1* | 8/2008 | Akiyama | H01L 21/76254 257/E21.103 |
| 2010/0045919 A1* | 2/2010 | Chida | H10K 59/12 438/30 |
| 2011/0212600 A1* | 9/2011 | Wang | H01L 21/02636 257/E21.09 |

FOREIGN PATENT DOCUMENTS

| | | |
|---|---|---|
| JP | 2010-226136 A | 10/2010 |
| JP | 2015-153775 A | 8/2015 |

OTHER PUBLICATIONS

Machine Translation of JP2008-021674 dated 2008 (Year: 2008).
U.S. Office Action for corresponding U.S. Appl. No. 16/317,751 dated Oct. 22, 2021 (14 Pages).
Ligatchev, V. et al.: "Influence of surface roughness and internal strain on defect spectrum and intensity of low-temperature photoluminescence of thin Si 1-x Gex layers"; Journal of Applied Physics; vol. 95; No. 12; Jun. 15, 2004; pp. 7681-7689 (10 pages).
Sutter, P. et al.: "Magnetron sputter epitaxy of SimGen/Si (001) strained-layer superlattices"; Applied Physics Letters; vol. 65; No. 17; Oct. 24, 1994; pp. 2220-2222 (4 pages).
Spila, T. et al.: "Effect of steady-state hydrogen coverage on the evolution of crosshatch morphology during Si1-xGex/S"; J. Appl. Phys.; Feb. 15, 2003; vol. 93; No. 4; pp. 1918-1925.
M. Kummer et al., "STM Study of Step-Graded Si1-xGex/Si(001) Buffers", Thin Solid Films 336, pp. 100-103 (1998).
Extended European Search Report for Patent Application No. EP 17827672.1 dated Jan. 22, 2020 (9 pages).
Taiwanese Office Action (with English translation) for Patent Application No. 106123693 dated Oct. 8, 2020 (9 pages).
Office Action dated May 5, 2021 issued for U.S. Appl. No. 16/317,751 (16 pages).
Choi et al. "Microstructural characterization of rf sputtered polycrystalline silicon germanium films", Journal of Applied Physics, vol. 91, No. 1, Jan. 2002. (Year: 2002).
Serenyi et al. "Fabrication of a-SiGe structure by rf sputtering for solar cell purposes", phys. Stat. Sol. (c) ), No. 3, 857-861 (2003). (Year: 2003).
Kubota et al. "Si1-xGex sputter epitaxy technique and its application to RTD", Thin Solid Films, 508 (2006) 20-23. (Year: 2006).
Japanese Office Action issued for corresponding Japanese Patent Application No. 2018-527637 dated Mar. 2, 2021 (6 pages).
Non-Final Office Action issued for the parent U.S. Appl. No. 16/317,751; Notification dated Feb. 8, 2022 (total 12 pages).
Saha et al. "Ion assisted growth and characterization of polycrystalline silicon and silicon-germanium films"; Journal of Applied Physics; vol. 83, No. 8; pp. 4472-4476; published on-line on Jul. 7, 1998 (total 6 pages).
Final Office Action issued in the parent U.S. Appl. No. 16/317,751; dated Jul. 1, 2022 (total 11 pages).
European Office Action for corresponding Application No. 17827672.1 dated Jan. 20, 2022 (7 Pages).

* cited by examiner

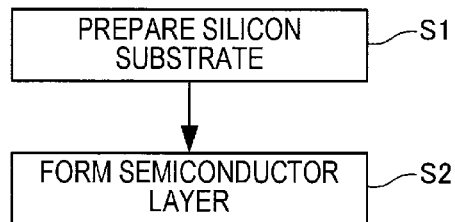
FIG. 5
| FILM FORMATION TEMPERATURE (°C) | HYDROGEN GAS 0.0001% | | HYDROGEN GAS 0.1% | | HYDROGEN GAS 5% | |
|---|---|---|---|---|---|---|
| | STATE | LATTICE MISMATCH RATE | STATE | LATTICE MISMATCH RATE | STATE | LATTICE MISMATCH RATE |
| 370 | – | – | – | – | AMORPHOUS | – |
| 400 | CRYSTALLINE | 0% | AMORPHOUS | – | CRYSTALLINE | – |
| 450 | CRYSTALLINE | 0% | AMORPHOUS | – | CRYSTALLINE | – |
| 500 | CRYSTALLINE | 0% | CRYSTALLINE | 0.29% | CRYSTALLINE | – |
| 560 | – | – | CRYSTALLINE | 0.07% | CRYSTALLINE | 0.39% |
FIG. 6
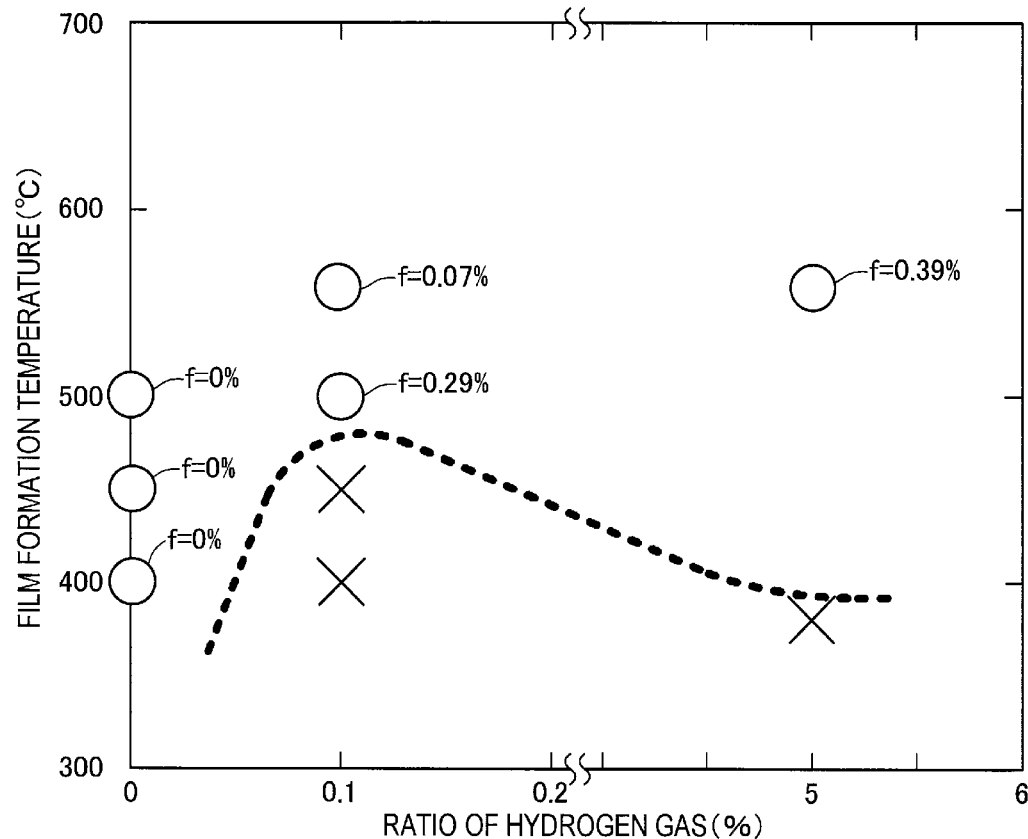
FIG. 7

| FILM FORMATION PRESSURE (mTorr) | LATTICE MISMATCH RATE (%) | | | |
|---|---|---|---|---|
| | 400°C | 450°C | 500°C | 600°C |
| 1.2 | 0 | – | 0.346 | – |
| 2 | 0 | 0 | 0 | 0.63 |
| 3.5 | 0 | – | 0 | – |
| 5 | 0 | 0.0014 | 0.551 | 0.5458 |
| 7 | 0 | – | – | – |
| 10 | 0 | – | – | – |

| COMPOSITION RATIO OF Ge | LATTICE MISMATCH RATE (%) | | | |
|---|---|---|---|---|
| | SPUTTERING METHOD | | | CVD METHOD |
| | t=50nm | t=125nm | t=280nm | t=74nm |
| 0.16 | – | – | – | 0.00672 |
| 0.17 | – | – | – | 0.0357 |
| 0.187 | – | – | – | 0.1021 |
| 0.233 | – | – | – | 0.34251 |
| 0.24 | – | 0 | 0 | – |
| 0.3 | – | – | 0.0099 | – |
| 0.313 | 0 | 0 | – | – |
| 0.355 | 0 | 0.007071 | – | – |
| 0.399 | 0 | 0.67669 | – | – |
| 0.43 | 0.018 | – | – | – |
| 0.474 | 0.67 | 1.4357 | – | – |

| COMPOSITION RATIO OF Ge | SURFACE ROUGHNESS (nm) | | | |
|---|---|---|---|---|
| | SPUTTERING METHOD | | | CVD METHOD |
| | t=50nm | t=125nm | t=280nm | t=74nm |
| 0.16 | – | – | – | 0.45 |
| 0.17 | – | – | – | 1 |
| 0.187 | – | – | – | 3 |
| 0.233 | – | – | – | 9 |
| 0.24 | – | – | 0.88 | – |
| 0.313 | – | 0.21 | – | – |
| 0.399 | 0.2 | 1.2 | – | – |
| 0.474 | 0.97 | – | – | – |

MANUFACTURING METHOD FOR SEMICONDUCTOR LAMINATED FILM, AND SEMICONDUCTOR LAMINATED FILM

CROSS REFERENCE TO RELATED APPLICATIONS

This application is divisional application of U.S. patent application Ser. No. 16/317,751 filed on Jan. 14, 2019, which is a U.S. National Phase Application of International Application No. PCT/JP2017/025436 filed on Jul. 12, 2017 and published in Japanese as WO 2018/012546 A1 on Jan. 18, 2018 and claims the benefit of priority from Japanese Patent Application No. 2016-140117 filed on Jul. 15, 2016. The entire disclosures of all of the above applications are incorporated herein by reference.

BACKGROUND

Technical Field

The present invention relates to a method of producing a semiconductor laminate film, and a semiconductor laminate film.

Related Art

As next-generation Si-based ultra-high speed devices, for example, the following devices for communication have been known: high electron mobility transistors (HEMTs); doped-channel field-effect transistors (DCFETs); resonant tunneling diodes (RTDs); hetero-bipolar transistors (HBTs); and strained-channel metal-oxide-semiconductor field-effect transistors (MOSFETs). Of those devices, particularly a HEMT using holes as carriers (p-HEMT or HHMT), a DCFET using holes as carriers (p-DCFET), a hole tunneling RTD (p-RTD), a hetero-bipolar transistor (HBT), a MOSFET with a strained SiGe channel using holes as carriers (strained-SiGe-channel p-MOSFET), and a buried-channel MOSFET using holes as carriers (buried-channel p-MOSFET) each use a hetero structure of a silicon (Si) substrate and a silicon germanium (SiGe) layer having such compressive strain as to be substantially lattice-matched with Si.

When SiGe with compressive strain is sandwiched between Si without strain (Si/SiGe with compressive strain/Si), the SiGe layer having compressive strain can form a potential well for a hole in a valence band through a change in a band width, to thereby realize a structure for achieving an increase in speed. In addition, when used as a channel, the SiGe layer having compressive strain can increase a mobility (speed) of a hole passing therethrough. Thus, an increase in speed of the device can be achieved. Particularly when the compressive strain of the SiGe layer is increased by increasing a composition ratio of Ge (ratio of the number of Ge atoms) in the SiGe layer, the potential well becomes deeper, and the mobility becomes higher, and thus a device having a higher speed can be achieved.

For example, in *Journal of Applied Physics*, vol. 95, no. 12, Jun. 15, 2004, pp. 7681-7689, there is described that a SiGe layer is formed on a Si substrate by a chemical vapor deposition (CVD) method. In addition, for example, in JP-A-2008-21674, there is described that a SiGe layer is formed on a Si substrate by a sputtering method using a mixed gas containing hydrogen as a sputtering gas.

However, each of the technology described in Journal of Applied Physics, vol. 95, no. 12 and the technology described in JP-A-2008-21674 has faced a difficult problem in terms of a technology for controlling formation of a semiconductor laminate film in the course of forming a SiGe layer having a high composition ratio of Ge (ratio of the number of Ge atoms) and large compressive strain, with which significant improvement in characteristics of a semiconductor device (e.g., an increase in carrier mobility, and an increase in speed of the semiconductor device) can be expected.

The inventors of the invention have focused attention on a sputtering method in order to form a SiGe layer having large compressive strain capable of sufficiently improving the characteristics of a semiconductor device, and have made extensive investigations on various film formation conditions. As a result, the inventors have found that a substrate temperature at the time of formation of the SiGe layer (film formation temperature), the concentration of hydrogen in a sputtering gas at the time of formation of the SiGe layer, and the pressure of the sputtering gas at the time of formation of the SiGe layer (film formation pressure) are particularly important.

An objective of the invention is to provide a method of producing a semiconductor laminate film capable of growing a semiconductor layer containing silicon and germanium so as to be better lattice-matched with a silicon substrate even when the semiconductor layer has a high composition ratio of germanium, to thereby produce a semiconductor device having satisfactory characteristics. Another objective of the invention is to provide a semiconductor laminate film which includes a semiconductor layer containing silicon and germanium which is better lattice-matched with a silicon substrate even when the semiconductor layer has a high composition ratio of germanium, and is thus capable of producing a semiconductor device having satisfactory characteristics.

SUMMARY

According to one embodiment of the invention, there is provided a method of producing a semiconductor laminate film, including
  forming a semiconductor layer containing silicon and germanium on a silicon substrate by a sputtering method,
  in the sputtering method,
  a film formation temperature of the semiconductor layer being less than 500° C., and a film formation pressure of the semiconductor layer ranging from 1 mTorr to 11 mTorr, or,
  a film formation temperature of the semiconductor layer being less than 600° C., and a film formation pressure of the semiconductor layer being equal to or more than 2 mTorr and less than 5 mTorr,
  the sputtering method using a sputtering gas having a volume ratio of a hydrogen gas of less than 0.1%, and
  the semiconductor layer satisfying a following relationship $$t \leq 0.881 \times x^{-4.79}$$

where t represents a thickness (nm) of the semiconductor layer, and x represents a ratio of the number of germanium atoms to a sum of the number of silicon atoms and the number of germanium atoms in the semiconductor layer.

In such method of producing a semiconductor laminate film, the semiconductor layer having larger compressive strain (i.e., a lower lattice mismatch rate f) than a semiconductor layer formed under the film formation conditions of, for example, a volume ratio of a hydrogen gas in the sputtering gas of 0.1% or more can be formed (the details are described later). Accordingly, in the method of producing a semiconductor laminate film, the semiconductor layer can be grown so as to be better lattice-matched with the silicon substrate even when the semiconductor layer has a high composition ratio of germanium. Thus, a semiconductor laminate film which leads to production of a semiconductor device having such high performance that the related art has not been able to achieve, or significant improvement in characteristics of the device can be produced.

In the above method of producing a semiconductor laminate film, the sputtering gas may have a volume ratio of a hydrogen gas of 0.0001% or less.

In the above method of producing a semiconductor laminate film, the semiconductor layer may satisfy a relationship of $t \leq 0.881 \times x^{-4.79}$, where t represents a thickness (nm) of the semiconductor layer, and x represents a ratio of the number of germanium atoms to a sum of the number of silicon atoms and the number of germanium atoms in the semiconductor layer.

In the above method of producing a semiconductor laminate film, a film formation temperature of the semiconductor layer ranges from 350° C. to 550° C.

In the above method of producing a semiconductor laminate film, the semiconductor layer may contain impurities configured to impart conductivity.

In the above method of producing a semiconductor laminate film, a film formation pressure of the semiconductor layer ranges from 2 mTorr to 4 mTorr.

In the above method of producing a semiconductor laminate film, the semiconductor layer may be lattice-matched with the silicon substrate.

In the above method of producing a semiconductor laminate film, the semiconductor layer may have a surface roughness Rms of 1 nm or less.

In the above method of producing a semiconductor laminate film, the semiconductor layer may include silicon and germanium.

According to one embodiment of the invention, there is provided a semiconductor laminate film including:
a silicon substrate; and
a semiconductor layer formed on the silicon substrate and containing silicon and germanium,
the semiconductor layer having a surface roughness Rms of 1 nm or less,
the semiconductor layer satisfying a following relationship $$t \leq 0.881 \times x^{-4.79}$$

where t represents a thickness (nm) of the semiconductor layer, and x represents a ratio of the number of germanium atoms to a sum of the number of silicon atoms and the number of germanium atoms in the semiconductor layer.

In such semiconductor laminate film, a semiconductor layer 20 can have larger compressive strain (i.e., a lower lattice mismatch rate f) even when the semiconductor layer 20 has a high composition ratio x of germanium (see the details described later). Accordingly, in such semiconductor laminate film, the semiconductor layer is better lattice-matched with the silicon substrate even when the semiconductor layer has a high composition ratio of germanium, and a semiconductor device having excellent characteristics can be produced.

In the above semiconductor laminate film, the semiconductor layer may be lattice-matched with the silicon substrate, and the semiconductor layer may satisfy a following relationship $$t < 0.881 \times x^{-4.79}$$

where t represents a thickness (nm) of the semiconductor layer, and x represents a ratio of the number of germanium atoms to a sum of the number of silicon atoms and the number of germanium atoms in the semiconductor layer.

In the above semiconductor laminate film, the semiconductor layer may have a surface roughness Rms of 0.5 nm or less.

In the above semiconductor laminate film, the semiconductor layer may include silicon and germanium.

BRIEF DESCRIPTION OF THE DRAWINGS

FIG. 5 is a flowchart for illustrating a method of producing a semiconductor laminate film according to an embodiment of the invention.

FIG. 6 is a table for illustrating a relationship among a ratio of hydrogen in a sputtering gas, a film formation temperature, and a lattice mismatch rate.

FIG. 7 is a chart for illustrating the relationship among the ratio of hydrogen in the sputtering gas, the film formation temperature, and the lattice mismatch rate.

DETAILED DESCRIPTION

Preferred embodiments of the invention are described in detail below with reference to the drawings. The following embodiments do not unduly limit the scope of the invention as stated in the claims. In addition, all of the elements described below should not necessarily be taken as essential elements of the invention.

1. Semiconductor Laminate Film

Figure 1:
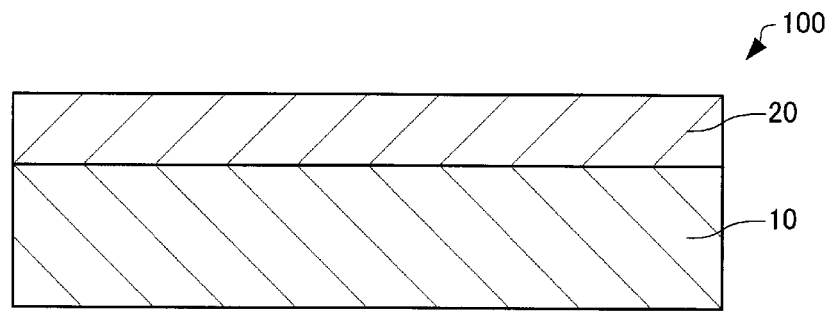
FIG. 1 is a sectional view for schematically illustrating a semiconductor laminate film according to an embodiment of the invention.

First, a semiconductor laminate film according to an embodiment of the invention is described with reference to the drawings. FIG. 1 is a sectional view for schematically illustrating a semiconductor laminate film 100 according to this embodiment.

As illustrated in FIG. 1, the semiconductor laminate film 100 includes a silicon (Si) substrate 10 and a semiconductor layer 20.

The material for the silicon substrate 10 is silicon. The silicon substrate 10 may be a monocrystalline substrate. The silicon substrate 10 may be a silicon on insulator (SOI) substrate, in which a monocrystalline silicon thin film is formed on an insulator, or a silicon on quartz (SOQ) substrate. The silicon substrate 10 may be, for example, a (100) substrate. The silicon substrate 10 may be formed of a monocrystalline silicon substrate and a silicon layer formed on the monocrystalline silicon substrate.

Figure 2:
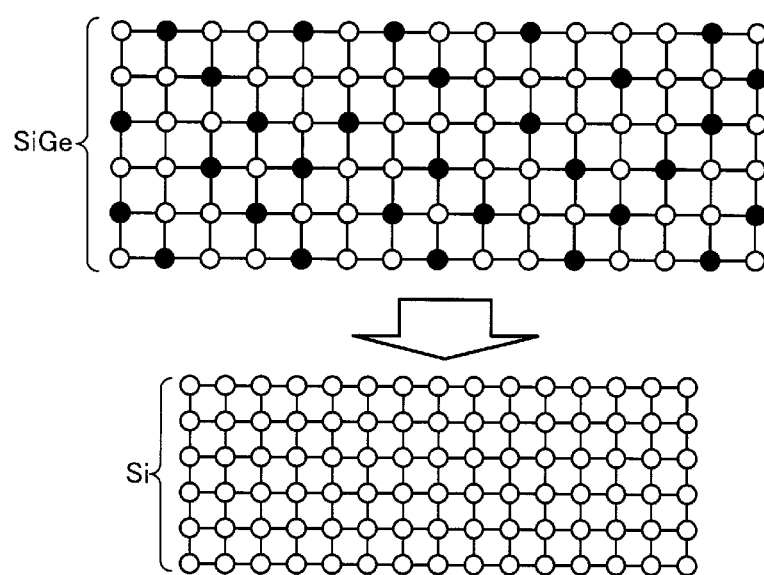
FIG. 2 is a diagram for illustrating a state in which a SiGe layer is lattice-matched with a silicon substrate.
Figure 3:
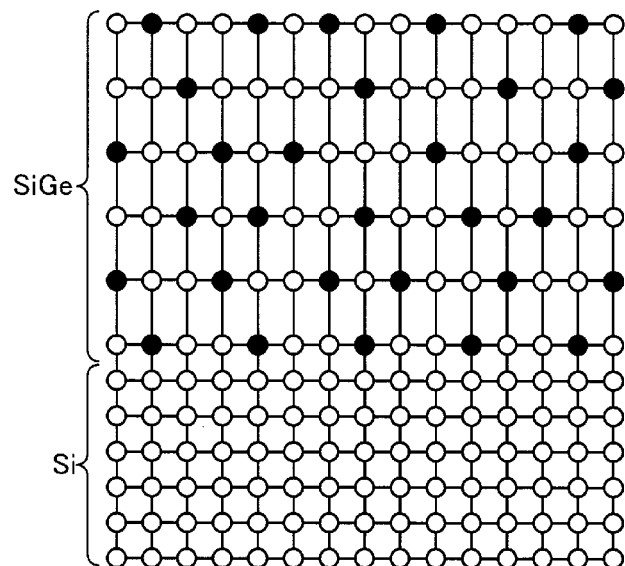
FIG. 3 is a diagram for illustrating the state in which the SiGe layer is lattice-matched with the silicon substrate.

The semiconductor layer 20 is formed on the silicon substrate 10. The semiconductor layer 20 contains silicon (Si) and germanium (Ge). The semiconductor layer 20 may be a semiconductor layer containing impurities configured to impart conductivity. The semiconductor layer 20 is substantially lattice-matched with the silicon substrate 10 and has large compressive strain. It is preferred that the semiconductor layer 20 be lattice-matched (completely lattice-matched) with the silicon substrate 10. The semiconductor layer 20 may be a $Si_{1-x}Ge_x$ layer (where 0<x<1) including silicon and germanium. Here, FIG. 2 and FIG. 3 are views for illustrating a state in which a SiGe layer is lattice-matched with a Si substrate. In each of FIG. 2 and FIG. 3, a white circle represents a Si atom, and a black circle represents a Ge atom.

In general, the $Si_{1-x}Ge_x$ layer has a larger lattice constant than the Si substrate. Si has a lattice constant of 0.543 nm and Ge has a lattice constant of 0.565 nm, and hence the $Si_{1-x}Ge_x$ layer has a lattice constant of more than 0.543 nm and less than 0.565 nm. In the semiconductor laminate film 100, as illustrated in FIG. 3, the semiconductor layer 20 (SiGe layer in the illustrated example) is compressed in a plane direction (in a direction perpendicular to a lamination direction) and pulled in the lamination direction, and is thus lattice-matched with the silicon substrate 10 (Si substrate in the illustrated example). Therefore, the semiconductor layer 20 has compressive strain in the plane direction. The above-mentioned state in which the semiconductor layer 20 has compressive strain, and the lattice constant of the semiconductor layer 20 is matched with the lattice constant of the silicon substrate 10 is referred to as "the semiconductor layer 20 is lattice-matched with the silicon substrate 10."

Figure 4:
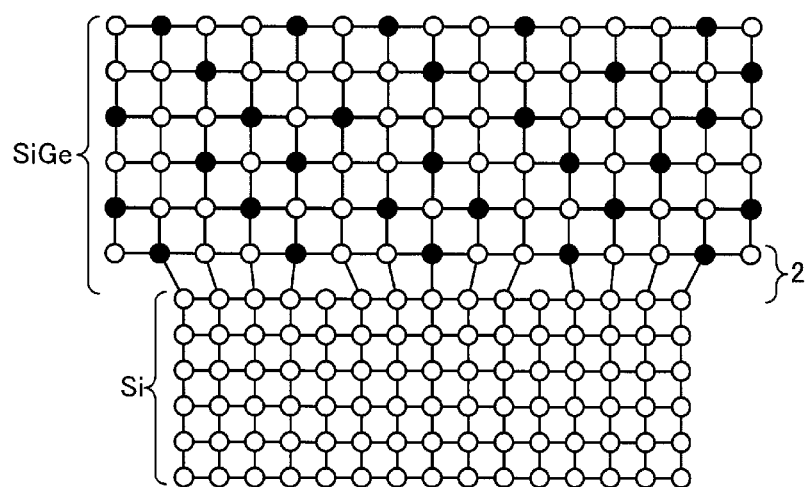
FIG. 4 is a diagram for illustrating a state in which the SiGe layer is not lattice-matched with the silicon substrate.

For example, when the SiGe layer is not lattice-matched with the Si substrate as illustrated in FIG. 4, the SiGe layer includes a relaxed interfacial region 2. With this, threading dislocation caused by a mismatch defect may occur on a surface of the semiconductor laminate film. In contrast, in the semiconductor laminate film 100, the occurrence of the threading dislocation can be sufficiently reduced because the semiconductor layer 20 is substantially lattice-matched with the silicon substrate 10. Accordingly, when the semiconductor laminate film 100 is used for a semiconductor device, the occurrence of malfunction resulting from the defect is sufficiently reduced, and the reliability of the semiconductor device can be improved.

When the semiconductor layer 20 is not completely lattice-matched with the silicon substrate 10, the semiconductor layer 20 has a lattice mismatch rate f of, for example, 0.3% or less, preferably 0.1% or less. As described above, it is preferred that the semiconductor layer 20 be lattice-matched (completely lattice-matched) with the silicon substrate 10, and in this case, the semiconductor layer 20 has a lattice mismatch rate f of 0%. When the semiconductor layer 20 has a lattice mismatch rate f of 0%, the lattice spacing of the semiconductor layer 20 in the plane direction is exactly the same as the lattice spacing of the silicon substrate 10 in the plane direction, and the semiconductor layer 20 is lattice-matched with the silicon substrate 10. When the lattice constant of Si is defined as $a_{Si}$, and the lattice constant of SiGe is defined as $a_{SiGe}$, the lattice mismatch rate f (%) can be determined by the following equation (1). The $a_{Si}$ and the $a_{SiGe}$ may be determined by, for example, reciprocal lattice map measurement based on X-ray diffraction in a (404) crystal orientation. Even in the case where the ratio of the number of Ge atoms in the SiGe layer is increased, when the SiGe layer is substantially lattice-matched with the silicon substrate and the lattice mismatch rate f is close to 0%, a SiGe layer having large compressive strain is obtained. With this, a potential well for a hole becomes deeper, and the mobility of the hole becomes higher, and thus the characteristics of the device are significantly improved.

$$f = (a_{SiGe} - a_{Si})/a_{Si} \times 100 \quad (1)$$

When the thickness of the semiconductor layer 20 is defined as t (nm), and the ratio of the number of Ge atoms to the sum of the number of Si atoms and the number of Ge atoms in the semiconductor layer 20 is defined as x (hereinafter also referred to as "composition ratio x of Ge"), the semiconductor laminate film 100 satisfies the relationship represented by the following expression (2). It is preferred that the semiconductor laminate film 100 satisfy the relationship represented by the following expression (3).

$$t \leq 0.881 \times x^{-4.79} \quad (2)$$

$$t < 0.881 \times x^{-4.79} \quad (3)$$

The thickness t of the semiconductor layer 20 may be measured by, for example, observing a sectional transmission electron microscope (TEM) image. The composition ratio x of Ge may be measured by, for example, secondary ion mass spectrometry (SIMS) or X-ray diffraction (XRD) spectroscopy. When the semiconductor layer 20 satisfies the expression (2), the lattice mismatch rate f can be reduced to almost 0%. When the semiconductor layer 20 satisfies the expression (3), the lattice mismatch rate f can be reduced to 0% (the details are described later). When the lattice mismatch rate f is 0%, the semiconductor layer 20 is lattice-matched with the silicon substrate 10, and such state is also referred as "the semiconductor layer 20 is completely compressively strained."

Specifically, when the thickness t of the semiconductor layer 20 is 280 nm or less, the composition ratio x of Ge is 0.30 or less. When the thickness t is 125 nm or less, the composition ratio x of Ge is 0.355 or less. When the thickness t is 50 nm or less, the composition ratio x of Ge is 0.43 or less. The semiconductor layer 20 has a thickness t ranging, for example, from 1 nm to 1 μm, preferably from 5 nm to 500 nm. The thickness t of the semiconductor layer 20 refers to a maximum value of magnitude of the semiconductor layer 20 in the lamination direction.

The semiconductor layer 20 has a surface roughness Rms (root mean square surface roughness) of 1 nm or less, preferably 0.5 nm or less. SiGe has a lattice constant of 0.543 nm or more, and hence when the Rms is 0.5 nm, the semiconductor layer 20 can have a surface roughness smaller than the lattice constant of SiGe. The surface roughness Rms is a root mean square roughness, and may be measured with an atomic force microscope (AFM).

The semiconductor layer 20 may contain at least one of carbon (C) or tin (Sn) as an additive. The concentration of C and Sn to be added as an additive is 20% or less with respect to a total number of atoms in the semiconductor layer 20. When C or Sn is added to the semiconductor layer 20, the lattice constant of the semiconductor layer 20 can be controlled. C has a lattice constant of 0.356 nm, which is smaller than the lattice constant of SiGe. Therefore, when C is added, the lattice constant of the semiconductor layer 20 can be reduced. In this case, the semiconductor layer 20 may be a $Si_{1-x-y}Ge_xC_y$ (0<y<x) layer including Si, Ge, and C. Meanwhile, Sn has a lattice constant of 0.646 nm, which is larger than the lattice constant of SiGe. Therefore, when Sn is added, the lattice constant of the semiconductor layer 20 can be increased. In this case, the semiconductor layer 20 may be a $Si_{1-x-y}Ge_xSn_y$ (0<y<x) layer including Si, Ge, and Sn.

For example, the semiconductor laminate film 100 has the following features.

The semiconductor laminate film 100 satisfies the above-mentioned expression (2). In such semiconductor laminate film 100, even when the semiconductor layer 20 has a high composition ratio x of Ge with respect to its thickness, the semiconductor layer 20 can have larger compressive strain (i.e., lower lattice mismatch rate f) than a semiconductor layer formed by, for example, a CVD method (see the details described later). Accordingly, in the semiconductor laminate film 100, even when the semiconductor layer 20 has a high composition ratio of Ge, the semiconductor layer 20 is better lattice-matched with the silicon substrate 10, and a semiconductor device having satisfactory characteristics can be produced. Specifically, when the semiconductor laminate film 100 is used for a semiconductor device, a deep potential well for a hole can be formed in a valence band. In addition, when the SiGe layer is used as a channel, the mobility (speed) of a hole passing therethrough can be increased. Thus, an increase in speed of the device can be achieved.

Further, in the semiconductor laminate film 100, the semiconductor layer 20 has a surface roughness Rms of 1 nm or less. As described above, the surface roughness Rms of the semiconductor layer 20 can be reduced in the semiconductor laminate film 100, and hence when the semiconductor laminate film 100 is used for the semiconductor device, a high-density device can be produced.

As described above, the semiconductor laminate film 100 can include the semiconductor layer 20 capable of producing the semiconductor device having satisfactory characteristics.

In the semiconductor laminate film 100, the semiconductor layer 20 may have a surface roughness Rms of 0.5 nm or less. Therefore, in the semiconductor laminate film 100, the surface roughness Rms of the semiconductor layer 20 can be reduced to be smaller than the lattice constant of SiGe, and a higher-density device can be produced.

The semiconductor laminate film 100 may satisfy the above-mentioned expression (3). In this case, the lattice mismatch rate f can be reduced to 0%, and the semiconductor layer 20 is lattice-matched with the silicon substrate 10.

2. Method of Producing a Semiconductor Laminate Film

Next, a method of producing the semiconductor laminate film 100 according to an embodiment of the invention is described with reference to the drawings. FIG. 5 is a flowchart for illustrating the method of producing the semiconductor laminate film 100 according to this embodiment.

First, as illustrated in FIG. 1, the silicon substrate 10 is prepared (Step S1).

Next, the semiconductor layer 20 is formed on the silicon substrate 10 by a sputtering method (Step S2). In the sputtering method, a sputtering gas is introduced into a chamber of a sputtering device, and a voltage is applied to a target to generate glow discharge and ionize atoms of the sputtering gas. The resultant gas ions are caused to collide with a surface of the target at high speed, and thus particles of a film formation material constituting the target are sputtered to deposit on a surface of the substrate, to thereby form a thin film. As the sputtering device, there is used, for example, a device in which a vacuum reaction vessel (chamber) and a sample introduction vessel (chamber) are connected to each other through a vacuum valve.

In the sputtering method for forming the semiconductor layer 20, the formation temperature of the semiconductor layer 20 is less than 600° C., preferably 350° C. or more and 550° C. or less, more preferably 350° C. or more and 450° C. or less. When the film formation temperature is less than 350° C., an activation rate of a dopant may be remarkably reduced in the case where a dopant (impurities), such as phosphorus, arsenic, antimony, boron, or gallium, is injected into the semiconductor layer 20. In addition, when the film formation temperature is set to 350° C. or more, the impurities can be activated without heating after the film formation, and the semiconductor layer 20 containing impurities configured to impart conductivity can be formed. When the film formation temperature is 600° C. or more, the lattice mismatch rate f may be increased. The film formation temperature of the semiconductor layer 20 refers to, for example, a substrate temperature of the silicon substrate 10 at the time of formation of the semiconductor layer 20 on the silicon substrate 10.

In the sputtering method for forming the semiconductor layer 20, the semiconductor layer 20 containing impurities may be formed by, for example, using a sputtering target in which impurities are mixed. Alternatively, the semiconductor layer 20 containing impurities may be formed by performing ion implantation after the film formation by the sputtering method. Alternatively, the semiconductor layer 20 containing impurities may be formed by performing heat diffusion using a gas containing impurities after the film formation by the sputtering method.

The semiconductor layer 20 may be formed by performing the sputtering method a plurality of times. That is, the semiconductor layer 20 may have a laminate structure of a plurality of layers. In this case, impurities may be incorporated in any one of the layers constituting the laminate structure, or may be incorporated in all the layers constituting the laminate structure. In addition, the expression (2) and the expression (3) are established when the thickness t (nm) is the total thickness of the laminated layers, and the ratio x is an average value (a value obtained by integrating x in a thickness direction in the range of the total thickness of the layers, and dividing the integrated value by t: $x=(\int xdt)/t$).

Before the formation of the semiconductor layer 20 on the silicon substrate 10, the silicon substrate 10 may be cleaned by, for example, being heated to 1,000° C. or more and 1,100° C. or less. With this, impurities contained in the silicon substrate 10 can be removed.

In the sputtering method for forming the semiconductor layer 20, the formation pressure of the semiconductor layer 20 ranges from 1 mTorr to 11 mTorr, preferably from 2 mTorr to 10 mTorr, more preferably from 2 mTorr to 5 mTorr still more preferably from 2 mTorr to 4 mTorr. When the formation pressure of the semiconductor layer 20 is less than 1 mTorr, such instability that discharge does not start may occur. When the formation pressure of the semiconductor layer 20 is more than 11 mTorr, the lattice mismatch rate f may be increased. The formation pressure of the semiconductor layer 20 refers to, for example, the pressure of a chamber (chamber of the sputtering device) in which the silicon substrate 10 is placed at the time of formation of the semiconductor layer 20 on the silicon substrate 10.

The sputtering method for forming the semiconductor layer 20 is performed under any of first conditions and second conditions described below.

First conditions: The film formation temperature is less than 500° C., and the film formation pressure ranges from 1 mTorr to 11 mTorr.

Second conditions: The film formation temperature is less than 600° C., and the film formation pressure is equal to or more than 2 mTorr and less than 5 mTorr.

In the sputtering method for forming the semiconductor layer 20, the sputtering gas has a volume ratio of a hydrogen gas of 0.1% or less, preferably 0.0001% or less, more preferably 0%. When the sputtering gas has a volume ratio of a hydrogen gas of more than 0.1%, the lattice mismatch rate f may be increased, or crystallization may not occur in the first place. Specifically, a mixed gas of an inert gas, such as argon (Ar), and a hydrogen gas, or an argon gas may be used as the sputtering gas. In general, a commercially available argon gas has a purity of about 99.9999%, and hydrogen is mixed therein at a ratio of 0.0001% or less. The same applies to the purities of other inert gases.

In the sputtering method for forming the semiconductor layer 20, a flow rate of the sputtering gas ranges, for example, from 0.1 cc/min to 10,000 cc/min when the sputtering gas to be supplied has a temperature of 0° C. under the atmospheric pressure. When the flow rate of the sputtering gas is set to fall within the above-mentioned range, the semiconductor layer 20 having compressive strain can be formed more reliably.

In the sputtering method for forming the semiconductor layer 20, a high-frequency power of the sputtering device ranges, for example, from 0.1 W/cm$^2$ to 20 W/cm$^2$ per unit area of the target. When a direct-current power is applied, the direct-current power is, for example, 0.1 W/cm$^2$ or more and 10 W/cm$^2$ or less. When the high-frequency power and the direct-current power are set to fall within the above-mentioned ranges, a formation speed of the semiconductor layer 20 and the composition ratio x can be controlled, and the semiconductor layer 20 having compressive strain can be formed more reliably.

Through the above-mentioned steps, the semiconductor laminate film 100 can be produced.

In the method of producing the semiconductor laminate film 100, the sputtering gas has a volume ratio of a hydrogen gas of less than 0.1%, and the sputtering method for forming the semiconductor layer 20 is performed under any of the first conditions and the second conditions described above. Further, in the method of producing the semiconductor laminate film 100, the above-mentioned expression (2) is satisfied. Therefore, in the method of producing the semiconductor laminate film 100, the semiconductor layer 20 having larger compressive strain (i.e., a lower lattice mismatch rate f) than a semiconductor layer formed under the film formation conditions of, for example, a volume ratio of a hydrogen gas of the sputtering gas of 0.1% or more can be formed (the details are described later). Accordingly, in the method of producing the semiconductor laminate film 100, even when the composition ratio of Ge is high, the semiconductor layer 20 can be grown so as to be lattice-matched with the silicon substrate 10. Thus, the semiconductor laminate film 100 capable of producing a semiconductor device having satisfactory characteristics can be produced.

In the method of producing the semiconductor laminate film 100, the sputtering gas may have a volume ratio of a hydrogen gas of 0.0001% or less. With this, in the method of producing the semiconductor laminate film 100, the semiconductor layer 20 having a lattice mismatch rate f of 0% can be formed (the details are described later).

3. Experimental Examples

The invention is described in more detail by way of Experimental Examples below. The invention is by no means limited by the following Experimental Examples.

3.1. Production of Sample

A SiGe layer was formed on a Si substrate by a sputtering method with a device in which a vacuum reaction vessel (chamber) and a sample introduction vessel (chamber) were connected to each other through a vacuum valve. The vacuum reaction vessel is equipped with a magnetron sputtering gun for Si and a magnetron sputtering gun for Ge.

Specifically, first, the vacuum reaction vessel was evacuated to vacuum. More specifically, the vacuum valve was closed, and the vacuum reaction vessel was evacuated to $1\times10^{-9}$ Torr or less. Moreover, while the vacuum valve was closed, the Si substrate was placed in the sample introduction vessel. Next, the sample introduction vessel was evacuated to a vacuum of $1\times10^{-7}$ Torr or less with a turbomolecular pump and a rotary pump each connected to the sample introduction vessel.

Next, while the degree of vacuum in the sample introduction vessel was kept, the vacuum valve was opened, and the Si substrate was placed at a predetermined position of the vacuum reaction vessel. Next, the vacuum valve was closed, and the vacuum reaction vessel was evacuated to a pressure of $1\times10^{-9}$ Torr or less in an ultra-high vacuum region. In the vacuum reaction vessel at a pressure of $1\times10^{-9}$ Torr or less, the Si substrate placed at the predetermined position was cleaned by being heated to 800° C. or more with a heater.

Next, a sputtering gas was introduced into the vacuum reaction vessel, and the flow rate of the sputtering gas was adjusted so that the sputtering gas in the vacuum reaction vessel achieved a predetermined pressure.

Next, the temperature of the Si substrate was adjusted to a predetermined value with the heater. Next, a sputtering target was covered with a shutter, and sputtering was started by applying a high-frequency power to the sputtering gun for Si from a high-frequency power source and applying a direct-current power to a Ge target. In this stage, Si and Ge having flown from the sputtering target adhere to a back surface of the shutter, and do not reach a surface of the Si substrate.

Next, under the state in which the sputtering was performed, the shutter was opened so that the sputtering target was viewed from the surface of the Si substrate. Film formation is started when Si atoms and Ge atoms having been sputtered reach the Si substrate. The sputtering rates of Si and Ge, and the ratio (composition ratio) x of the number of Ge atoms to the sum of the number of Si atoms and the number of Ge atoms were controlled with the high-frequency power and the direct-current power in advance. Thus, the SiGe layer was formed on the Si substrate.

After the formation of the SiGe layer, the supply of the power to the sputtering guns was stopped, introduction of the sputtering gas was stopped, and the heating with the heater was stopped. The Si substrate having formed thereon the SiGe layer was taken out to a sample introduction vessel side by a reverse procedure to the procedure of its introduction into the vacuum reaction vessel. Specifically, while the pressure of the vacuum reaction vessel was kept at $1 \times 10^{-7}$ Torr or less, the Si substrate was transferred to the sample introduction vessel, and the vacuum valve was closed. After the vacuum valve was closed, the vacuum reaction vessel was evacuated to $1 \times 10^{-9}$ Torr or less with a vacuum pump connected to the vacuum reaction vessel, and the degree of vacuum was maintained.

By the above-mentioned procedures, a semiconductor laminate film of the SiGe layer formed on the Si substrate was produced.

3.2. Relationship Among Ratio of Hydrogen in Sputtering Gas, Film Formation Temperature, and Lattice Mismatch Rate A SiGe ($Si_{0.7}Ge_{0.3}$) layer was formed on a Si substrate by the method described in the section "3.1." The thickness of the SiGe layer was set to 30 nm. The formation pressure of the SiGe layer was set to 3 mTorr. The SiGe layer was formed by using, as a sputtering gas, the following three kinds of gases: an Ar gas having a purity of 99.9999% (containing 0.0001% or less of a hydrogen gas etc.); a mixed gas of 99.9% of an Ar gas and 0.1% of a hydrogen gas; and a mixed gas of 95% of an Ar gas and 5% of a hydrogen gas ("%" represents a volume ratio), and setting the film formation temperature to 370° C., 400° C., 450° C., 500° C., and 560° C.

The lattice mismatch rate f of the SiGe layer formed as described above (the lattice mismatch rate f of the SiGe layer with respect to the Si substrate) was determined. The lattice constants of Si and SiGe were determined by a reciprocal lattice map based on X-ray diffraction in a (404) crystal orientation or a (224) crystal orientation, and the lattice mismatch rate f was determined by the above-mentioned equation (1). FIG. 6 is a table for illustrating a relationship among the ratio (volume ratio) of hydrogen in the sputtering gas, the film formation temperature, and the lattice mismatch rate. FIG. 7 is a chart obtained by plotting the values in the table of FIG. 6.

In FIG. 6, also the state of the SiGe layer is illustrated. The "crystalline" refers to a case in which a peak was observed in the X-ray diffraction, and the "amorphous" refers to a case in which a peak was not observed in the X-ray diffraction. In FIG. 7, the boundary between the "crystalline" and the "amorphous" is represented by the broken line. The state at a temperature higher than the broken line corresponds to the "crystalline", and the state at a temperature lower than the broken line corresponds to the "amorphous".

As illustrated in FIG. 6 and FIG. 7, as the mixing ratio of the hydrogen gas became smaller, the lattice mismatch rate f became lower. When the ratio of the hydrogen gas was 5%, the lattice mismatch rate f exceeded 0.3%, however, when the ratio of the hydrogen gas was 0.1%, the lattice mismatch rate f was less than 0.3%. In the case where the ratio of the hydrogen gas was 0.1%, the result was obtained that, when the temperature exceeded 500° C. and approached 600° C., the lattice mismatch rate f was drastically reduced and nearly lattice matching conditions were achieved. This is presumably because hydrogen is desorbed from the SiGe layer at high temperature, and lattice matching is easily achieved. Further, when the ratio of the hydrogen gas was 0.0001% or less, the lattice mismatch rate f was 0%.

3.3. Relationship Among Film Formation Pressure, Film Formation Temperature, and Lattice Mismatch Rate A SiGe ($Si_{0.77}Ge_{0.23}$) layer was formed on a Si substrate by the method described in the section "3.1." The thickness of the SiGe layer was set to 273 nm. As a sputtering gas, an Ar gas having a purity of 99.9999% (containing 99.9999% of an Ar gas and 0.0001% or less of a hydrogen gas etc.) was used. The film formation pressure was set to 1.2 mTorr, 2 mTorr, 3.5 mTorr, 5 mTorr, 7 mTorr, and 10 mTorr. The film formation temperature was set to 400° C., 450° C., 500° C., and 600° C. In this experiment, the conditions were set to the above-mentioned film formation temperature range in view of general applications of the film formation temperature because the activation rate of impurities decreased in a film formation temperature range of less than 350° C., and the surface flatness decreased in a film formation temperature range of more than 600° C.

Figures 8, 9:
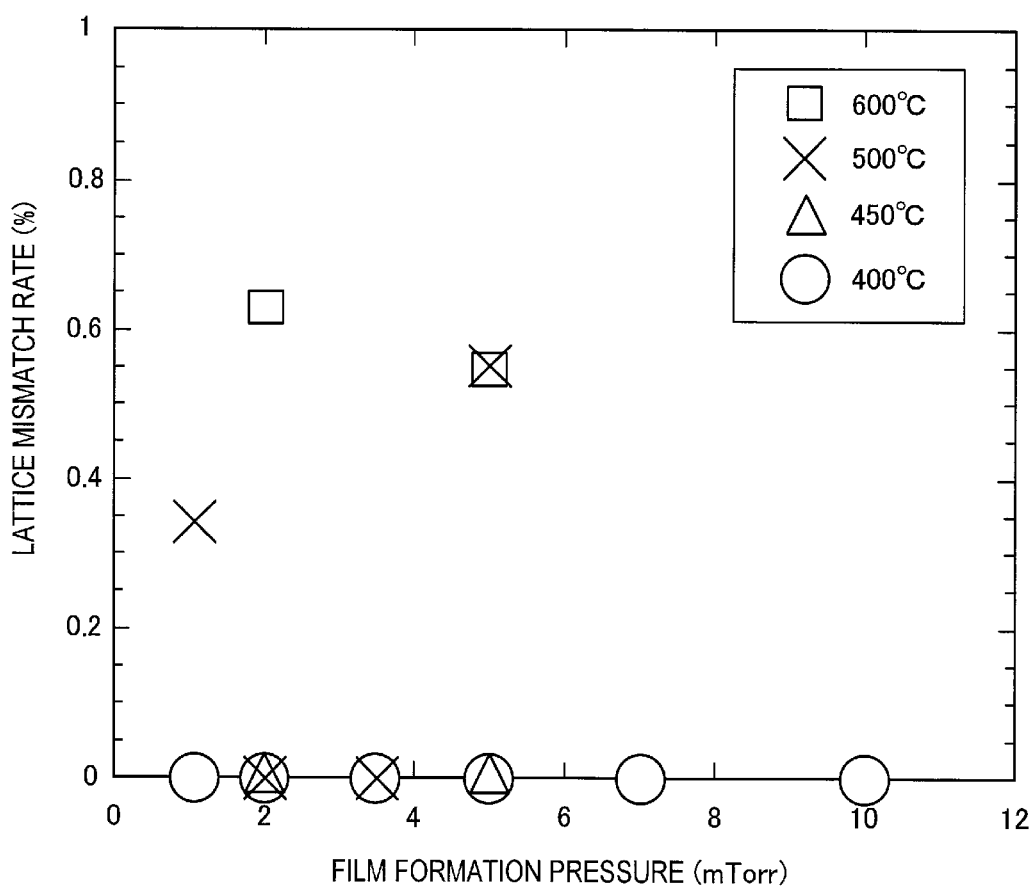
FIG. 8 is a table for illustrating a relationship among a film formation pressure, a film formation temperature, and a lattice mismatch rate.
FIG. 9 is a chart for illustrating the relationship among the film formation pressure, the film formation temperature, and the lattice mismatch rate.

The lattice mismatch rate f of the SiGe layer formed as described above was determined. FIG. 8 is a table for illustrating a relationship among the film formation pressure, the film formation temperature, and the lattice mismatch rate f. FIG. 9 is a chart obtained by plotting the values in the table of FIG. 8.

As illustrated in FIG. 8 and FIG. 9, when the film formation temperature was less than 500° C. and the film formation pressure ranged from 1 mTorr to 11 mTorr, the lattice mismatch rate f was almost 0% (under the first conditions described above). In addition, when the film formation temperature was less than 600° C. and the film formation pressure ranged from 2 mTorr to 5 mTorr, the lattice mismatch rate f was almost 0% (under the second conditions described above). Further, when the film formation temperature ranged from 400° C. to 500° C. and the film formation pressure ranged from 2 mTorr to 4 mTorr, the lattice mismatch rate f was 0%.

As described above, from FIG. 6 to FIG. 9, it was revealed that, when the film formation temperature was set to less than 500° C., the film formation pressure was set to range from 1 mTorr to 11 mTorr, and the volume ratio of a hydrogen gas in the sputtering gas was set to less than 0.1%, the SiGe layer having large compressive strain as compared to a case in which the volume ratio of a hydrogen gas in the sputtering gas was set to, for example, 0.1% or more was able to be formed. In addition, it was revealed that, when the film formation temperature was set to less than 600° C., the film formation pressure was set to equal to or more than 2 mTorr and less than 5 mTorr, and the volume ratio of a hydrogen gas in the sputtering gas was set to less than 0.1%, the SiGe layer having large compressive strain as compared to a case in which the volume ratio of a hydrogen gas in the sputtering gas was set to, for example, more than 0.1% was able to be formed.

3.4. Relationship Among Composition Ratio of Ge, Thickness, and Lattice Mismatch Rate A $Si_{1-x}Ge_x$ layer was formed on a Si substrate by the method described in the section "3.1." As a sputtering gas, an Ar gas having a purity of 99.9999% (containing 99.9999% of an Ar gas and 0.0001% or less of a hydrogen gas etc.) was used. The film formation temperature was set to 400° C., and the film formation pressure was set to 3.5 mTorr. In each of the cases in which the thickness t of the $Si_{1-x}Ge_x$ layer was set to 50 nm, 125 nm, and 280 nm, the composition ratio x of Ge in the $Si_{1-x}Ge_x$ layer which grew so as to be lattice-matched with the Si substrate was determined.

Figures 10, 11:
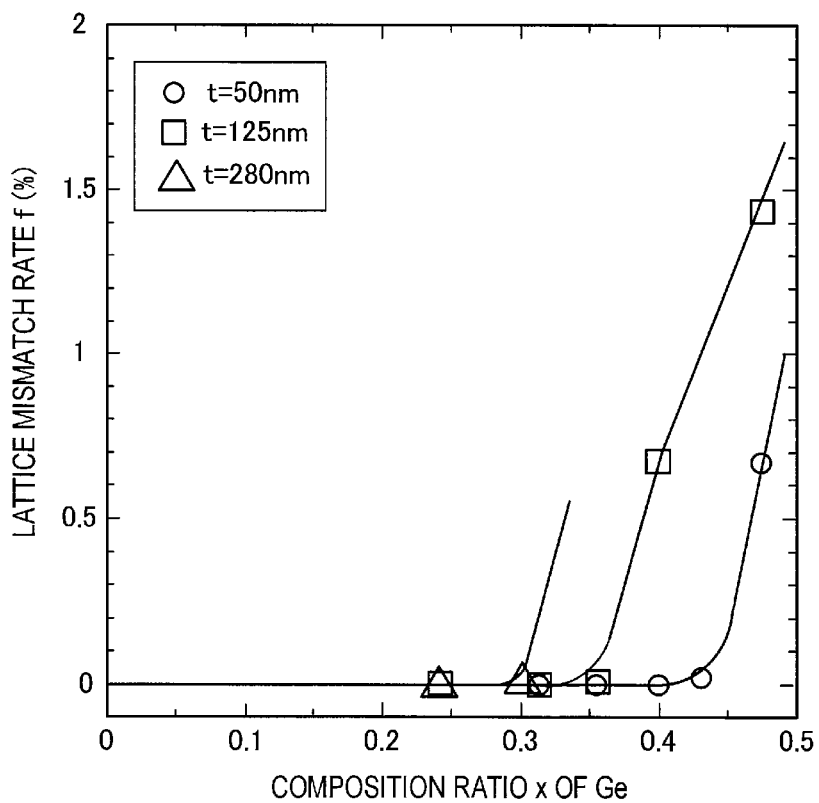
FIG. 10 is a table for illustrating a relationship among a composition ratio of Ge, a thickness, and a lattice mismatch rate.
FIG. 11 is a chart for illustrating the relationship among the composition ratio of Ge, the thickness, and the lattice mismatch rate in the case of film formation by a sputtering method.

The lattice mismatch rate f of the $Si_{1-x}Ge_x$ layer formed as described above was determined. FIG. 10 is a table for illustrating a relationship among the composition ratio of Ge, the thickness, and the lattice mismatch rate f. FIG. 11 is a chart obtained by plotting the values in the table of FIG. 10.

Figure 12:
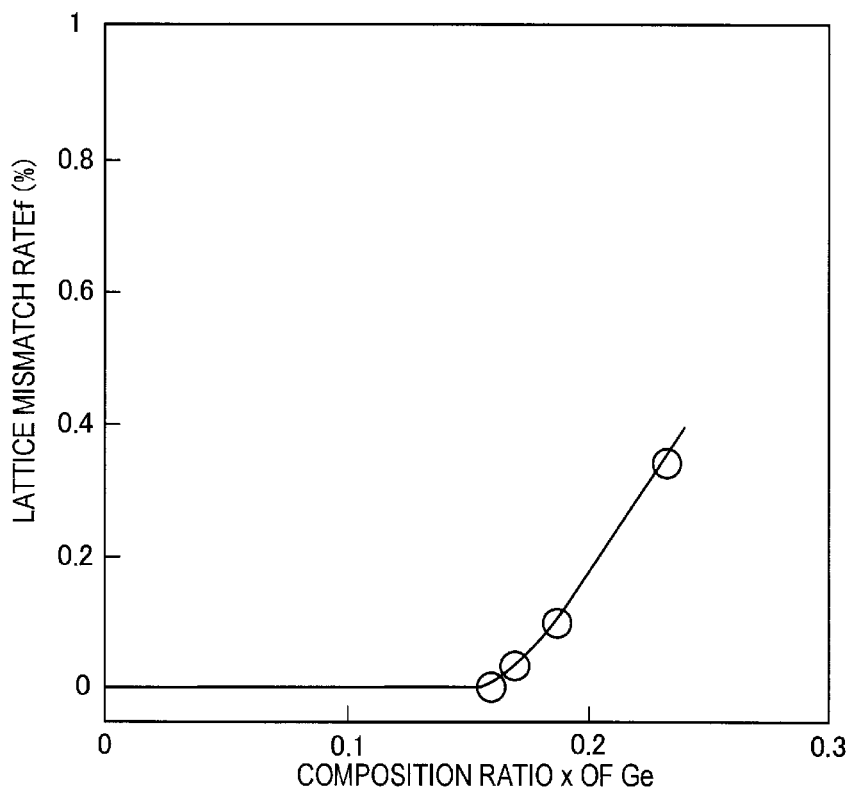
FIG. 12 is a chart for illustrating the relationship among the composition ratio of Ge, the thickness, and the lattice mismatch rate in the case of film formation by a CVD method.

In FIG. 10, the results of a $Si_{1-x}Ge_x$ layer (74 nm) formed on a Si substrate by a CVD method were also illustrated as Comparative Example. In addition, FIG. 12 is a chart obtained by plotting the values in the case of a CVD method in the table of FIG. 10.

Figure 13:
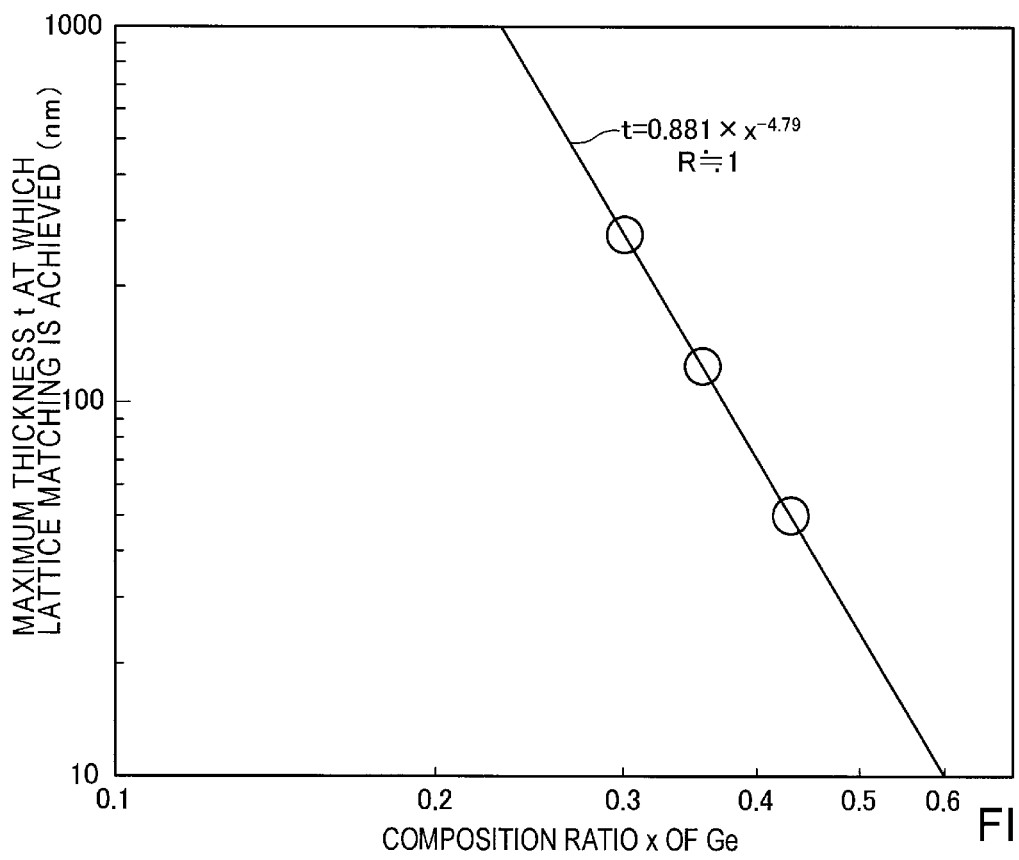
FIG. 13 is a chart for illustrating a relationship between a composition ratio of Ge and a maximum thickness at which lattice matching is achieved.

As illustrated in FIG. 10 and FIG. 11, as the composition ratio x of Ge became smaller, the lattice mismatch rate f became lower. Further, as the thickness t (nm) became smaller, the lattice mismatch rate f was able to be reduced more even when the composition ratio x of Ge was increased. From FIG. 10 and FIG. 11, it is considered that border composition ratios x of Ge below which the lattice mismatch rate f can be sufficiently reduced to almost 0% are 0.43, 0.355, and 0.3 at the thicknesses t of 50 nm, 125 nm, and 280 nm, respectively. When the three points (50, 0.43), (125, 0.355), and (280, 0.3) were plotted as in FIG. 13, the following equation (4) of a line passing through the three points was able to be obtained. The maximum thickness t (nm) at which lattice matching is achieved is plotted on the ordinate of FIG. 13.

$$t=0.881 \times x^{-4.79} \quad (4)$$

Accordingly, it was revealed that the lattice mismatch rate f was able to be reduced to 0% when the expression $t<0.881 \times x^{-4.79}$ was satisfied. The correlation coefficient R of the equation (4) was almost 1.

In addition, as illustrated in FIG. 11 and FIG. 12, it was revealed that, even when the composition ratio x of Ge was increased, the lattice mismatch rate f was able to be reduced more in the case of formation of the $Si_{1-x}Ge_x$ layer by the method described in the section "3.1." than in the case of formation of the $Si_{1-x}Ge_x$ layer by a CVD method.

Figures 14, 15:
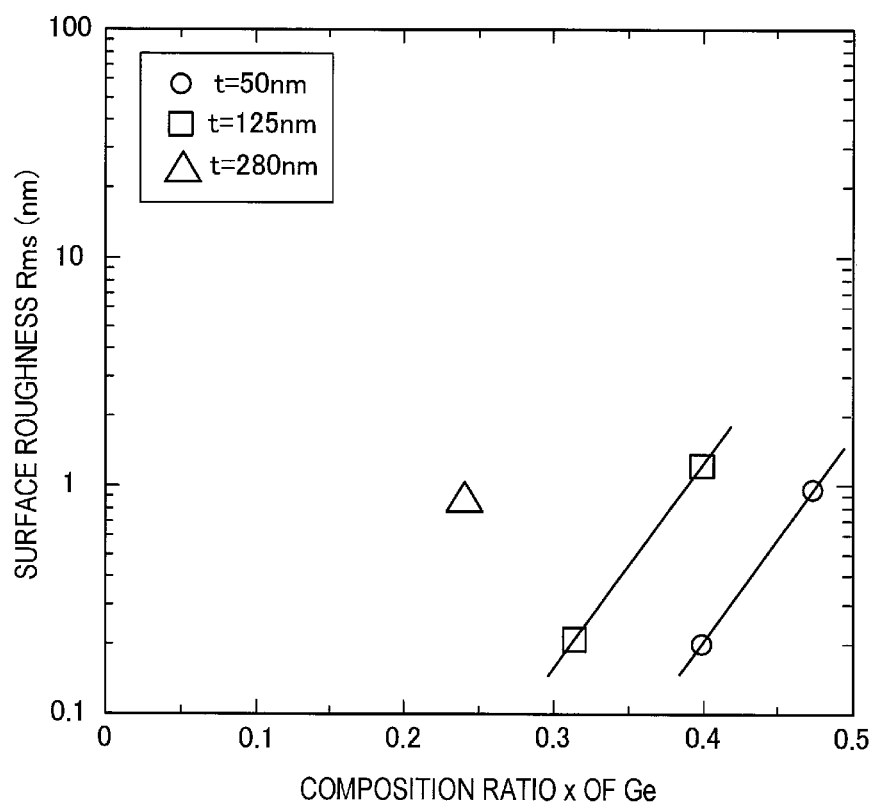
FIG. 14 is a table for illustrating a relationship among a composition ratio of Ge, a thickness, and a surface roughness.
FIG. 15 is a chart for illustrating the relationship among the composition ratio of Ge, the thickness, and the surface roughness in the case of film formation by a sputtering method.

3.5. Relationship Among Composition Ratio of Ge, Thickness, and Surface Roughness A $Si_{1-x}Ge_x$ layer formed by the method described in the section "3.4." was measured for a surface roughness Rms (root mean square surface roughness) with an AFM. FIG. 14 is a table for illustrating a relationship among the composition ratio of Ge, the thickness, and the surface roughness.

Figure 16:
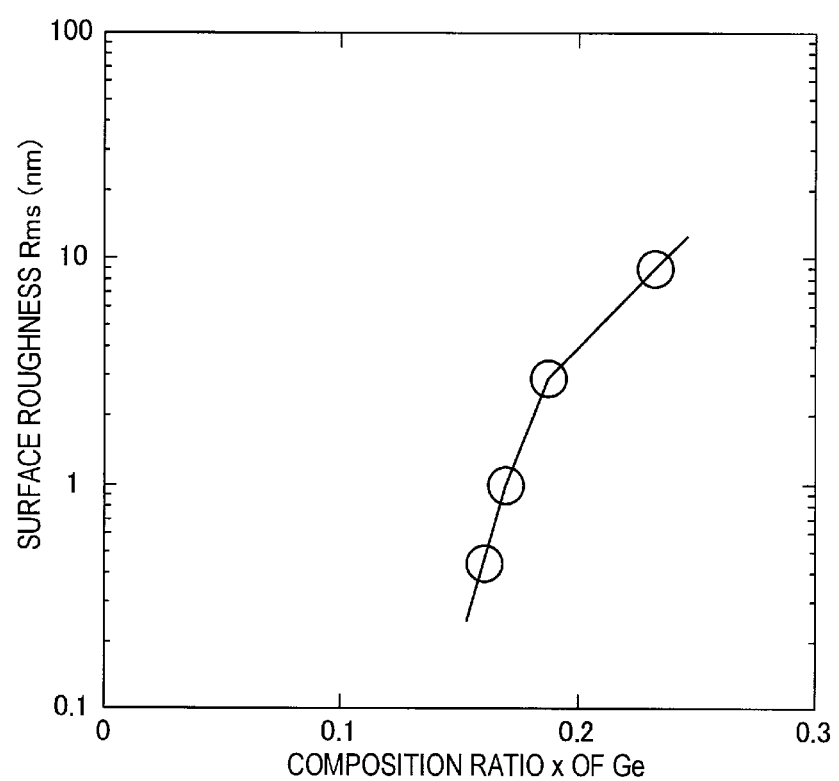
FIG. 16 is a chart for illustrating the relationship among the composition ratio of Ge, the thickness, and the surface roughness in the case of film formation by a CVD method.

FIG. 15 is a chart obtained by plotting the values in the case of a sputtering method illustrated in the table of FIG. 14. FIG. 16 is a chart obtained by plotting the values in the case of a CVD method illustrated in the table of FIG. 14.

As illustrated in FIG. 14 and FIG. 15, as the composition ratio x of Ge became larger, the surface roughness Rms became larger. Further, as the thickness t became larger, the surface roughness Rms became larger.

In addition, as illustrated in FIG. 15 and FIG. 16, it was revealed that, even when the composition ratio x of Ge was increased, the surface roughness Rms was able to be reduced more in the case of formation of the $Si_{1-x}Ge_x$ layer by the method described in the section "3.1." than in the case of formation of the $Si_{1-x}Ge_x$ layer by a CVD method.

4. Semiconductor Device Including Semiconductor Laminate Film

Next, a semiconductor device including the semiconductor laminate film according to the invention is described. A semiconductor device including the above-mentioned semiconductor laminate film 100 as the semiconductor laminate film according to the invention is described below.

4.1. First Semiconductor Device

Figure 17:
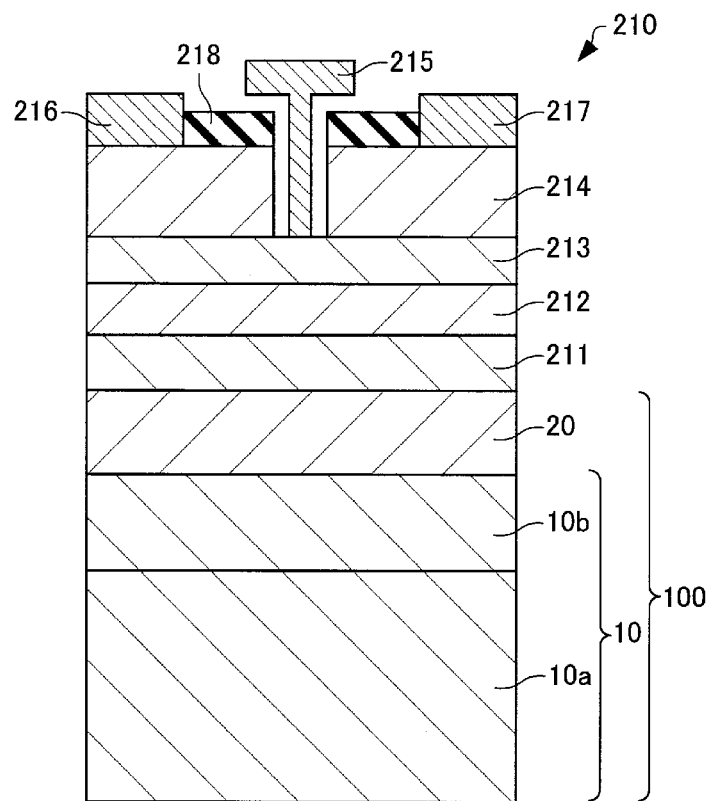
FIG. 17 is a sectional view for schematically illustrating a first semiconductor device according to an embodiment of the invention.

FIG. 17 is a sectional view for schematically illustrating a first semiconductor device 210 according to an embodiment of the invention. The first semiconductor device 210 is a HEMT using holes as carriers (p-HEMT or a high hole mobility transistor (HHMT)). As illustrated in FIG. 17, the first semiconductor device 210 includes: a silicon substrate 10; a semiconductor layer 20; a Si spacer layer 211; a Si supply layer 212; a Si spacer layer 213; a Si cap layer 214; a gate electrode 215; a source electrode 216; and a drain electrode 217.

The silicon substrate 10 includes: a n-type (100) Si substrate 10a; and an i-type Si layer 10b arranged on the Si substrate 10a. The Si substrate 10a may be a monocrystalline substrate. The silicon substrate 10 may be a silicon on insulator (SOI) substrate, in which a monocrystalline silicon thin film is formed on an insulator, or a silicon on quartz (SOQ) substrate. The Si layer 10b has a thickness of, for example, about 40 nm.

The semiconductor layer 20 is arranged on the silicon substrate 10. The semiconductor layer 20 is of an i type. The semiconductor layer 20 has a thickness of, for example, about 10 nm. The semiconductor layer 20 is a channel layer using holes as carriers.

The Si spacer layer 211 is arranged on the semiconductor layer 20. The Si spacer layer 211 is of an i type. The Si spacer layer 211 has a thickness of, for example, 1 nm or more and 10 nm or less.

The Si supply layer 212 is arranged on the Si spacer layer 211. The Si supply layer 212 is of a p type. The Si supply layer 212 has a thickness of, for example, 1 nm or more and 10 nm or less. The Si supply layer 212 is configured to supply a carrier (hole) to the semiconductor layer 20.

The Si spacer layer 213 is arranged on the Si supply layer 212. The Si spacer layer 213 is of an i type. The Si spacer layer 213 has a thickness of, for example, 1 nm or more and 10 nm or less. The gate electrode 215 is arranged on the Si spacer layer 213.

The Si cap layer 214 is arranged on the Si spacer layer 213. The Si cap layer 214 is of a p type. The Si cap layer 214 has a thickness of, for example, 5 nm or more and 50 nm or less. The source electrode 216 and the drain electrode 217 are arranged on the Si cap layer 214. Further, a $SiO_2$ layer, a SiN layer, an insulating resist layer, or the like is arranged as a protective layer 218 on the Si cap layer 214. The protective layer 218 may not be arranged.

The first semiconductor device 210 includes the semiconductor layer 20. As described above, even when the semiconductor layer 20 has a sufficiently large composition ratio x of Ge with respect to its thickness, the semiconductor layer 20 can be reduced in lattice mismatch rate f and thus can have large compressive strain. Here, in the HEMT using holes as carriers, as the composition ratio x of Ge is increased more, the compressive strain can be increased more, and a carrier mobility can be increased more. Accordingly, in the first semiconductor device 210, an increase in carrier mobility can be achieved, and thus an increase in speed can be achieved by increasing the composition ratio x of Ge and increasing the compressive strain. In addition, the semiconductor layer 20 does not include a dopant atom, and a hole carrier does not suffer from impurities scattering, with the result that a reduction in carrier mobility does not occur. The hole carrier configured to impart electrical conductivity to the semiconductor layer 20 is supplied from the Si supply layer 212.

4.2. Second Semiconductor Device

Figure 18:
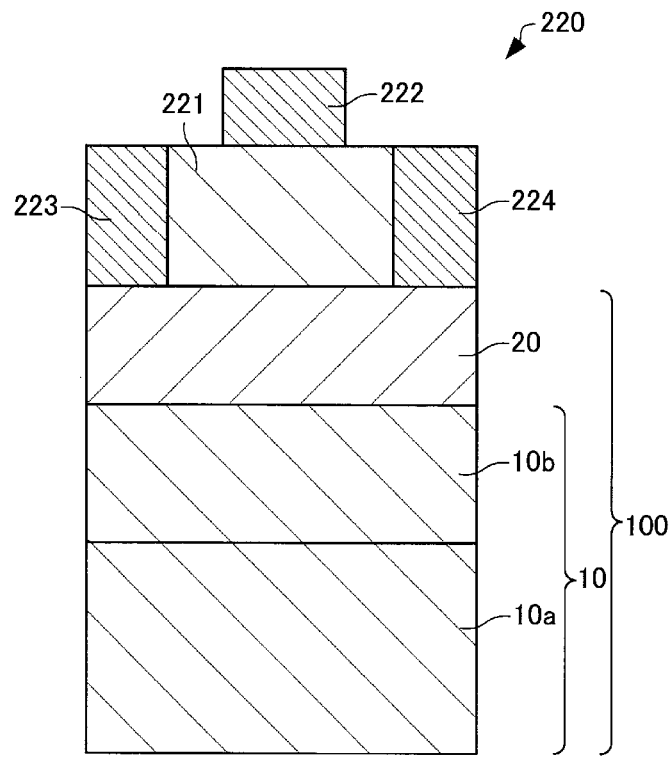
FIG. 18 is a sectional view for schematically illustrating a second semiconductor device according to an embodiment of the invention.

FIG. 18 is a sectional view for schematically illustrating a second semiconductor device 220 according to an embodiment of the invention. The second semiconductor device 220 is a doped channel field effect transistor (DCFET) using holes as carriers (p-DCFET). As illustrated in FIG. 18, the second semiconductor device 220 includes: a silicon substrate 10; a semiconductor layer 20; a Si cap layer 221; a gate electrode 222; a source electrode 223; and a drain electrode 224.

The silicon substrate 10 includes: a n-type (100) Si substrate 10a; and an i-type Si layer 10b arranged on the Si substrate 10a. The Si substrate 10a may be a monocrystalline substrate. The silicon substrate 10 may be a silicon on insulator (SOI) substrate, in which a monocrystalline silicon thin film is formed on an insulator, or a silicon on quartz (SOQ) substrate. The Si layer 10b has a thickness of, for example, 10 nm or more and 100 nm or less.

The semiconductor layer 20 is arranged on the silicon substrate 10. The semiconductor layer 20 is of a p type. The semiconductor layer 20 has a thickness of, for example, 10 nm or more and 100 nm or less. The semiconductor layer 20 is a channel layer using holes as carriers. The source electrode 223 and the drain electrode 224 are arranged on the semiconductor layer 20.

The Si cap layer 221 is arranged on the semiconductor layer 20. The Si cap layer 221 is of an i type. The Si cap layer 221 has a thickness of, for example, 10 nm or more and 100 nm or less. The gate electrode 222 is arranged on the Si cap layer 214.

The second semiconductor device 220 includes the semiconductor layer 20. As described above, even when the semiconductor layer 20 has a sufficiently large composition ratio x of Ge with respect to its thickness, the semiconductor layer 20 can be reduced in lattice mismatch rate f and thus can have large compressive strain. Here, in the DCFET using holes as carriers, as the composition ratio x of Ge is increased more, the compressive strain is increased more, and a hole mobility is increased more. Accordingly, in the second semiconductor device 220, a further increase in speed can be achieved by increasing the composition ratio x of Ge and increasing the compressive strain.

4.3. Third Semiconductor Device

Figure 19:
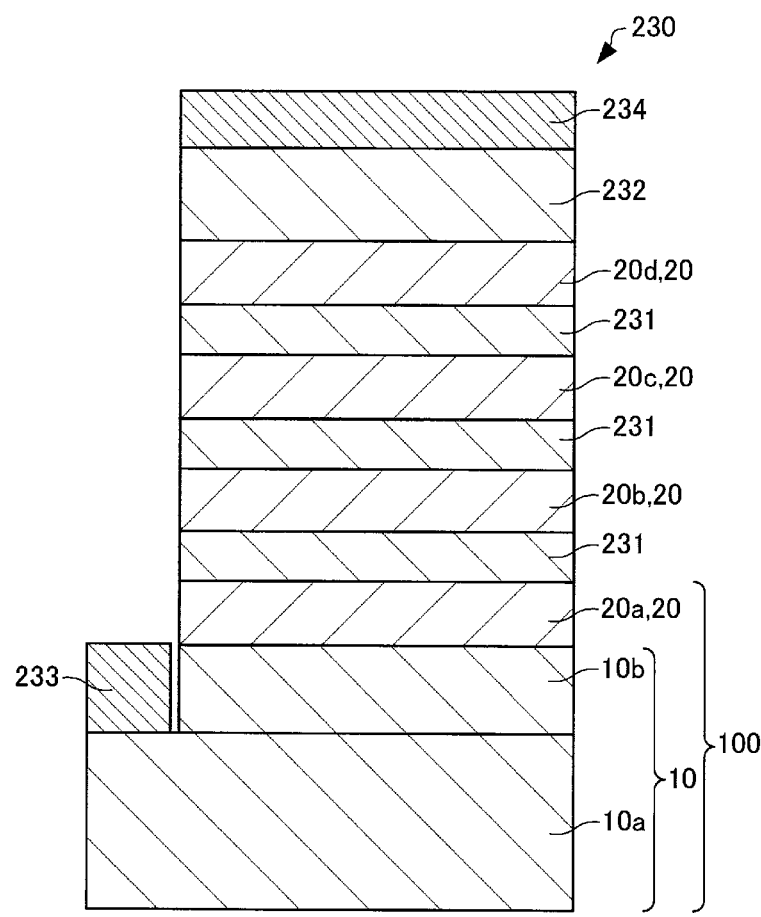
FIG. 19 is a sectional view for schematically illustrating a third semiconductor device according to an embodiment of the invention.

FIG. 19 is a sectional view for schematically illustrating a third semiconductor device 230 according to an embodiment of the invention. The third semiconductor device 230 is a hole tunneling resonant tunneling diode (RTD) (p-RTD). The third semiconductor device 230 includes: a silicon substrate 10; a semiconductor layer 20; a Si layer 231; a Si layer 232; an electrode layer 233 formed of, for example, Al; and an electrode layer 234 formed of, for example, Al. The third semiconductor device 230 includes four SiGe semiconductor layers 20a, 20b, 20c, and 20d.

The silicon substrate 10 includes: a p-type (100) Si substrate 10a; and a p-type Si layer 10b arranged on the Si substrate 10a. The Si substrate 10a may be a monocrystalline substrate. The silicon substrate 10 may be a silicon on insulator (SOI) substrate, in which a monocrystalline silicon thin film is formed on an insulator, or a silicon on quartz (SOQ) substrate. The Si layer 10b has a thickness of, for example, 10 nm or more and 100 nm or less. The electrode layer 233 is arranged on the Si substrate 10a. The electrode layer 233 is one of electrodes of the third semiconductor device 230.

The semiconductor layer 20a is arranged on the silicon substrate 10. The SiGe semiconductor layers 20a, 20b, 20c, and 20d are laminated in the stated order, and the Si layers 231 are arranged between the semiconductor layers 20a, 20b, 20c, and 20d. The semiconductor layers 20a, 20b, 20c, and 20d are each formed of i-type SiGe. The semiconductor layers 20a and 20d each have a thickness of, for example, 10 nm or more and 100 nm or less. The semiconductor layers 20b and 20c each have a thickness of, for example, 1 nm or more and 6 nm or less. The Si layers 231 are each of an i type. The Si layers 231 each have a thickness of, for example, 1 nm or more and 3 nm or less. The semiconductor layers 20b and 20c are each a quantum well layer, and the Si layers 231 are each a barrier layer.

The Si layer 232 is arranged on the semiconductor layer 20d. The Si layer 232 is of a p type. The Si layer 232 has a thickness of, for example, 10 nm or more and 100 nm or less. The electrode layer 234 formed of, for example, Al is arranged on the Si layer 232. The electrode layer 234 is the other one of the electrodes of the third semiconductor device 230.

The third semiconductor device 230 includes the semiconductor layer 20. As described above, even when the semiconductor layer 20 has a sufficiently large composition ratio x of Ge with respect to its thickness, the semiconductor layer 20 can have large compressive strain. Here, in the hole tunneling RTD, as the composition ratio x of Ge is increased more and the compressive strain is increased more, a deep potential well is formed more easily, and a larger resonant current is obtained, with the result that an operation speed is increased more. Accordingly, in the third semiconductor device 230, a further increase in speed can be achieved by increasing the composition ratio x of Ge and increasing the compressive strain.

4.4. Fourth Semiconductor Device

Figure 20:
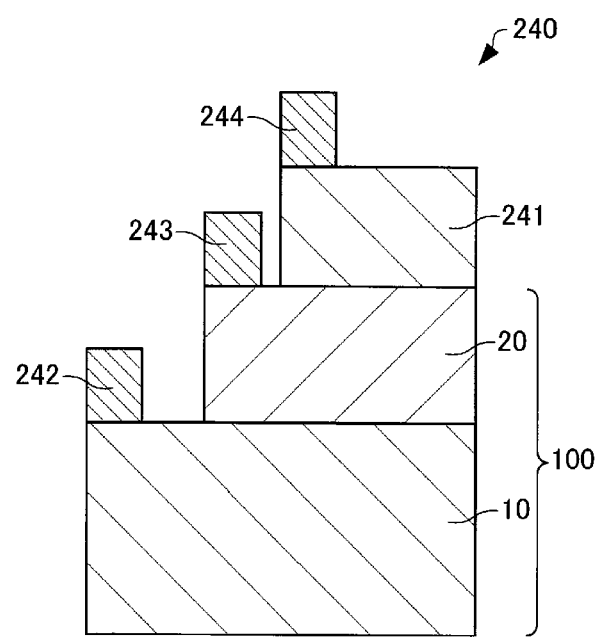
FIG. 20 is a sectional view for schematically illustrating a fourth semiconductor device according to an embodiment of the invention.

FIG. 20 is a sectional view for schematically illustrating a fourth semiconductor device 240 according to an embodiment of the invention. The fourth semiconductor device 240 is a npn-type hetero-bipolar transistor (HBT). As illustrated in FIG. 20, the fourth semiconductor device 240 includes: a silicon substrate 10; a semiconductor layer 20; a Si layer 241; a collector electrode 242; a base electrode 243; and an emitter electrode 244.

The silicon substrate 10 is a n-type (100) Si substrate. The silicon substrate 10 corresponds to a collector region. A n-type Si layer may be arranged on the silicon substrate 10. The collector electrode 242 is arranged on the silicon substrate 10. The silicon substrate 10 may be a monocrystalline substrate. The silicon substrate 10 may be a silicon on insulator (SOI) substrate, in which a n-type monocrystalline silicon thin film is formed on an insulator, or a silicon on quartz (SOQ) substrate. Alternatively, the silicon substrate 10 may be a SOI substrate or a SOQ substrate having formed thereon a n-type Si layer.

The semiconductor layer 20 is arranged on the silicon substrate 10. The semiconductor layer 20 corresponds to a base region. The composition ratio x of Ge in the semiconductor layer 20 may vary in a direction perpendicular to a surface of the substrate. The semiconductor layer 20 is of a p type. The semiconductor layer 20 has a thickness of, for example, 30 nm or more and 200 nm or less. The base electrode 243 is arranged on the semiconductor layer 20.

The Si layer 241 is arranged on the semiconductor layer 20. The Si layer 241 is of a n type. The Si layer 241 corresponds to an emitter region. The Si layer 241 has a thickness of, for example, 20 nm or more and 100 nm or less. The emitter electrode 244 is arranged on the Si layer 241.

The fourth semiconductor device 240 includes the semiconductor layer 20. As described above, even when the semiconductor layer 20 has a large composition ratio x of Ge, the semiconductor layer 20 can be lattice-matched or substantially lattice-matched with the silicon substrate 10 or the n-type silicon layer arranged on the silicon substrate. In the npn-type HBT, as the composition ratio x of Ge is increased more, a larger potential barrier is formed for a hole in a valence band at a boundary between the emitter region and the base region, and a current amplification factor can be increased more. Accordingly, in the fourth semiconductor device 240, an increase in current amplification factor can be achieved, and a further increase in speed can be achieved by increasing the composition ratio x of Ge and increasing the compressive strain.

The use of the semiconductor laminate film 100 is not limited to the semiconductor devices described above. For example, the semiconductor laminate film 100 may be used for a MOSFET with a strained SiGe channel using holes as carriers (strained-SiGe-channel p-MOSFET), or a MOSFET with a buried-SiGe-channel using holes as carriers (buried-channel p-MOSFET). For example, the buried-channel p-MOSFET can be realized by replacing the Si cap layer 221 of the second semiconductor device 220 with the following two layers laminated on each other: an i-type Si spacer layer; and an insulating layer, such as a $SiO_2$ layer. In this case, the i-type Si spacer layer is arranged on the lower side of the two layers.

According to the above-mentioned technology for forming the semiconductor layer according to the invention, the semiconductor laminate film including the SiGe layer which has a low lattice mismatch rate, and is substantially lattice-matched or lattice-matched with the Si substrate, and which has a large composition ratio of Ge can be produced. Utilization of a semiconductor device using the technology for the semiconductor laminate film according to the invention is expected to contribute to an increase in performance and a reduction in cost of an electronic device component for millimeter waveband applications. The semiconductor device is expected to significantly contribute to advancement of, for example, wireless communication or a radar in a millimeter waveband, object image detection, and a non-invasive and non-destructive test as an electronic device technology serving as a foundation for high-frequency electronics and measurement sensing technologies in the future in industrial technical fields related to sensor networks, artificial intelligence (AI), internet of things (IoT), and the like. The semiconductor laminate film according to the invention is particularly effective for an increase in performance of a p-type channel transistor, which is inferior in performance of an operation speed to a n-type channel transistor, and also enables a remarkable reduction in power consumption by achieving a high-frequency amplifier with a complementary configuration.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. A semiconductor laminate film comprising:
a silicon substrate; and
a semiconductor layer formed on the silicon substrate and containing silicon and germanium,
the semiconductor layer having a surface roughness Rms of 1 nm or less,
the semiconductor layer being lattice-matched with the silicon substrate such that a lattice mismatch rate of the semiconductor layer is 0%,
the semiconductor layer satisfying a following relationship
$t < 0.881 \times x^{-4.79}$
where t represents a thickness (nm) of the semiconductor layer, and x represents a ratio of the number of germanium atoms to a sum of the number of silicon atoms and the number of germanium atoms in the semiconductor layer, and
the semiconductor layer being a mixed crystal semiconductor layer containing silicon and germanium.

2. The semiconductor laminate film according to claim 1, wherein the semiconductor layer has a surface roughness Rms of 0.5 nm or less.

3. The semiconductor laminate film according to claim 1, wherein the semiconductor layer includes silicon and germanium.

4. The semiconductor laminate film according to claim 1, wherein the semiconductor layer has a thickness of 125 nm or more.

5. A semiconductor laminate film comprising:
a silicon substrate; and
a semiconductor layer formed on the silicon substrate and containing silicon and germanium,
the semiconductor layer having a surface roughness Rms of 1 nm or less,
the semiconductor layer being lattice-matched with the silicon substrate such that a lattice mismatch rate of the semiconductor layer is 0%,
the semiconductor layer satisfying a following relationship
$t < 0.881 \times x^{-4.79}$
where t represents a thickness (nm) of the semiconductor layer, and x represents a ratio of the number of germanium atoms to a sum of the number of silicon atoms and the number of germanium atoms in the semiconductor layer, and a ratio of a number of germanium atoms to a sum of a number of silicon atoms and the number of germanium atoms in the semiconductor layer being 0.313 or more.

\* \* \* \* \*